United States Patent
Hirose et al.

(10) Patent No.: US 7,925,944 B2
(45) Date of Patent: Apr. 12, 2011

(54) SEMICONDUCTOR DEVICE

(75) Inventors: Masaya Hirose, Kyoto (JP); Takeshi Yamamoto, Osaka (JP); Kinya Daio, Kyoto (JP); Kenji Watanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 301 days.

(21) Appl. No.: 12/241,722

(22) Filed: Sep. 30, 2008

(65) Prior Publication Data
US 2009/0161813 A1 Jun. 25, 2009

(30) Foreign Application Priority Data
Dec. 19, 2007 (JP) .................. 2007-327872

(51) Int. Cl.
*G01R 31/28* (2006.01)
(52) U.S. Cl. ......... 714/729; 324/537; 714/719; 714/724
(58) Field of Classification Search .................. 324/537
See application file for complete search history.

(56) References Cited

U.S. PATENT DOCUMENTS

| | | | |
|---|---|---|---|
| 4,584,673 A | 4/1986 | Kuijk | |
| 4,989,209 A * | 1/1991 | Littlebury et al. | 714/724 |
| 6,762,560 B1 * | 7/2004 | Guosheng | 314/101 |
| 6,952,213 B2 * | 10/2005 | Ebihara | 345/505 |
| 7,246,280 B2 * | 7/2007 | Kim et al. | 714/719 |
| 2010/0117658 A1 * | 5/2010 | Hapke et al. | 324/537 |

FOREIGN PATENT DOCUMENTS
JP 04-107757 4/1992

OTHER PUBLICATIONS

Whetzel, Lee; "Adapting Scan Architectures for Low Power Operation", ITC international Test Conference, Paper 33.1, p. 863-872, © 2000 IEEE.*
Girard, Patrick; "Low Power Testing of VLSI Circuits: Problems and Solutions", IEEE Proc. Symp. on Quality Electronic Design, pp. 173-179 (2000).*
Pomeranz et al. "Generation of Functional Broadside Tests for Transitional Faults", IEEE Transactions on Computer-Aided Design of Integrated Circuits and Systems, vol. 25, No. 10, Oct. 2006, pp. 2207-2218.*

(Continued)

*Primary Examiner* — Timothy J Dole
*Assistant Examiner* — Benjamin M Baldridge
(74) *Attorney, Agent, or Firm* — McDermott Will & Emery LLP

(57) ABSTRACT

In a semiconductor device including an N-line M-stage shift register circuit operated at high speed of, for example, several hundreds MHz. Input circuits input a common test pattern to each of pairs of shift registers in, for example, two lines out of the N lines. A plurality of outputs of the pairs of shift registers in the two lines are compared in comparators, and the comparison results are output. The N-line M-stage shift register circuit and the comparators are operated in synchronization with a clock signal at several hundreds MHz. Hence, even when the circuit scale (area) of the N-line M-stage shift register circuit is increased to involve apparent wiring delay, a defect in the shift register circuit can be detected at an actual speed.

3 Claims, 4 Drawing Sheets

OTHER PUBLICATIONS

Rosinger et al., "Scan Architecture with Mutually Exclusive Scan Segment Activation for Shift- and Capture-Power Reduction", IEEE Transactions on Computer Aided Design of Integrated Circuits and Systems, vol. 23, No. 7, Jul. 2004.*

Savir et al. "Broad-Side Delay Test", IEEE Transactions on Computer-Aided Design of Integrated Circuits and Systems, vol. 13, No. 8, Aug. 1994.*

Wang, Seongmoon; "LT-RTPG: A New Test-Per-Scan BIST TPG for Low Heat Dissipation", ITC International Test Conference, Paper 4.2, pp. 85-94, © 1999 IEEE.*

* cited by examiner

SEMICONDUCTOR DEVICE

CROSS REFERENCE TO RELATED APPLICATIONS

This non-provisional application claims priority under 35 U.S.C. §119(a) on Patent Application No. 2007-327872 filed in Japan on Dec. 19, 2007, the entire contents of which are hereby incorporated by reference.

BACKGROUND OF THE INVENTION

The present invention relates to semiconductor devices including a multi-line-by-multi-stage shift register circuit, and particularly relates to testing thereof at its actual speed.

Recently, the operation speed of a semiconductor device is increasing more and more. As one kind of function circuits composing the semiconductor device, a multi-line multi-stage shift register circuit composed of flip-flop circuits arranged in matrix is operated at an actual speed of several hundred MHz, for example. A technique for testing the shift register circuit at the actual speed is demanded.

A memory error check system is disclosed in Japanese Unexamined Patent Application Publication 4-107757 as a storage circuit testing technique. This memory error check system includes: a memory for storing the same data as an upper half of a word and a lower half of the word; an expected value storage register for reading out the upper half data at a first timing and temporarily storing it as an expected value; a circuit for reading out the lower half data at a second timing subsequent to the first timing; and a comparator circuit for comparing the read out lower half data and the upper half data stored in the expected value storage register, wherein the comparison result is used as memory error check information.

The above conventional testing technique necessitates the expected value storage register as an additional dedicated component for testing to increase the circuit scale. In the case where the above conventional testing technique is applied to testing on the multi-line multi-stage shift register circuit, an increase in circuit scale (area) of the shift register circuit accompanies apparent wiring delay to invite difficulty in high speed testing at an actual speed of, for example, several hundred MHz.

SUMMARY OF THE INVENTION

The present invention has its object of enabling, in a semiconductor device including a multi-line multi-stage shift register circuit operated at an actual speed of, for example, several hundred MHz, error detection in the shift register circuit at the actual speed even if increased scale (areas) of the shift register circuit involves apparent wiring delay.

To attain the above object, the semiconductor device in accordance with the present invention employs a comparatively simple testing configuration which eliminates the need to provide an expected value storage register dedicated for testing only.

Specifically, a semiconductor device in accordance with the present invention includes a N-line M-stage shift register circuit including shift registers of M-stages in N lines in parallel to each other (where M and N each are an integer equal to or larger than 2), a plurality of sets of shift registers in a plurality of lines out of the N lines being formed in the N-line M-stage shift register circuit, wherein each of the sets includes: an input circuit for inputting a common test pattern to a corresponding set of shift registers in a plurality of lines out of the N lines; and a comparator for comparing outputs of a corresponding set of the shift registers in the plurality of lines.

In one embodiment of the semiconductor device in the present invention, each of the sets of shift registers to which the common test pattern is input does not include shift registers in lines adjacent to each other.

In one embodiment of the semiconductor device in the present invention, one of two test patterns is input to a set of shift registers in given lines at least two lines apart from each other while the other test pattern is input to another set of shift registers in other lines at least two lines apart from each other, one of the other lines being adjacent to one of the given lines, and the two test patterns having phases reverse to each other in an arbitrary period.

In one embodiment of the semiconductor device in the present invention, the semiconductor device further includes a reference signal generation circuit for generating a clock signal as a reference signal, wherein the N-line M-stage shift register circuit and the comparator circuits in each of the sets are operated in synchronization with the clock signal supplied from the reference signal generation circuit.

In one embodiment of the semiconductor device in the present invention, the semiconductor device further includes a test pattern generation circuit for inputting the test pattern to the input circuit in each of the sets, the test pattern generation circuit being operated in synchronization with the clock signal supplied from the reference signal generation circuit.

With the above arrangement, the present invention eliminates the need to provide an expected value storage register that has been conventionally indispensable. Further, simple testing configuration in which only outputs of the shift registers in the plural lines are compared with each other leads to a countermeasure against wiring delay. This leads to reduction in chip size and enables testing at the actual speed.

DETAILED DESCRIPTION OF THE PREFERRED EMBODIMENTS

Preferred embodiments of the present invention will be described below with reference to the accompanying drawings.

Embodiment 1

Figure 1:
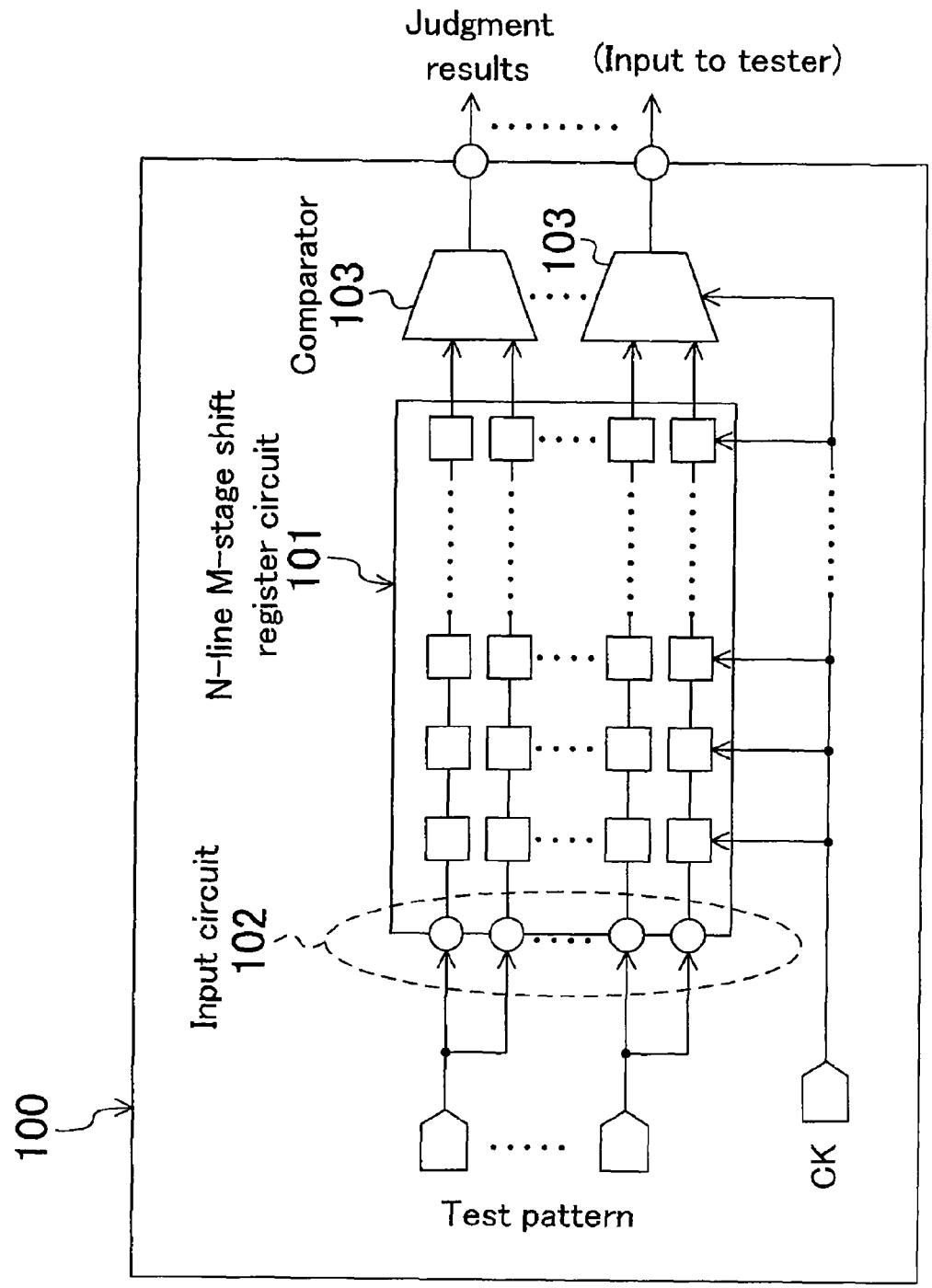
FIG. 1 is a schematic block diagram showing an overall semiconductor device in accordance with Embodiment 1 of the present invention.

FIG. 1 is a block diagram showing a configuration of a semiconductor device in accordance with Embodiment 1.

In FIG. 1, a semiconductor device 100 includes: an N-line M-stage shift register circuit 101 (M and N are each an integer equal to or larger than 2); N input circuits 102; and N/2 comparators 103. The shift register circuit 101 includes shift registers of M-stages in N lines parallel to each other. Each input circuit 102 inputs a common test pattern to M-stage shift registers in adjacent two lines. Each comparator 103 compares two output signals from M-stage shift registers in adjacent two lines at a comparison timing according to a clock signal CL. Each comparator 103 outputs L (level) when the two output signals agree with each other while on the other hand outputting H (level) when the they do not agree with each other.

The thus configured semiconductor device 100 in the present embodiment will be described. In the semiconductor device 100, each input circuit 102 inputs a common test pattern to a pair of shift registers in adjacent two lines out of N lines of the N-line M-stage shift register circuit 101. The test pattern is changed in synchronization with the clock signal CK. As well, the shift register circuit 101 and the comparators 103 are operated in synchronization with the clock signal CK.

Output signals of the pair of the M-stage shift registers in the adjacent two lines, which correspond to the test pattern input thereto are input to a comparator 103 in synchronization with the clock signal CK. The comparator 103 compares the thus input signals, judges the comparison result, and outputs the judgment result outside the semiconductor device 100.

Subsequently, the judgment results from the comparators 103 after M-th clock cycle from a start of test pattern input are input to an LSI tester for L-expected value judgment. Output of H means detection of a circuit defect.

In the present embodiment, an expected value storage register for testing only, which is indispensable in the conventional technique, becomes unnecessary, and the testing configuration is simplified such that outputs of shift registers in adjacent two lines are compared, which serves as a countermeasure against wiring delay.

The shift registers in adjacent two lines are paired in the present embodiment, but shift registers in adjacent three or more lines may be combined as one set.

Embodiment 2

Figure 2:
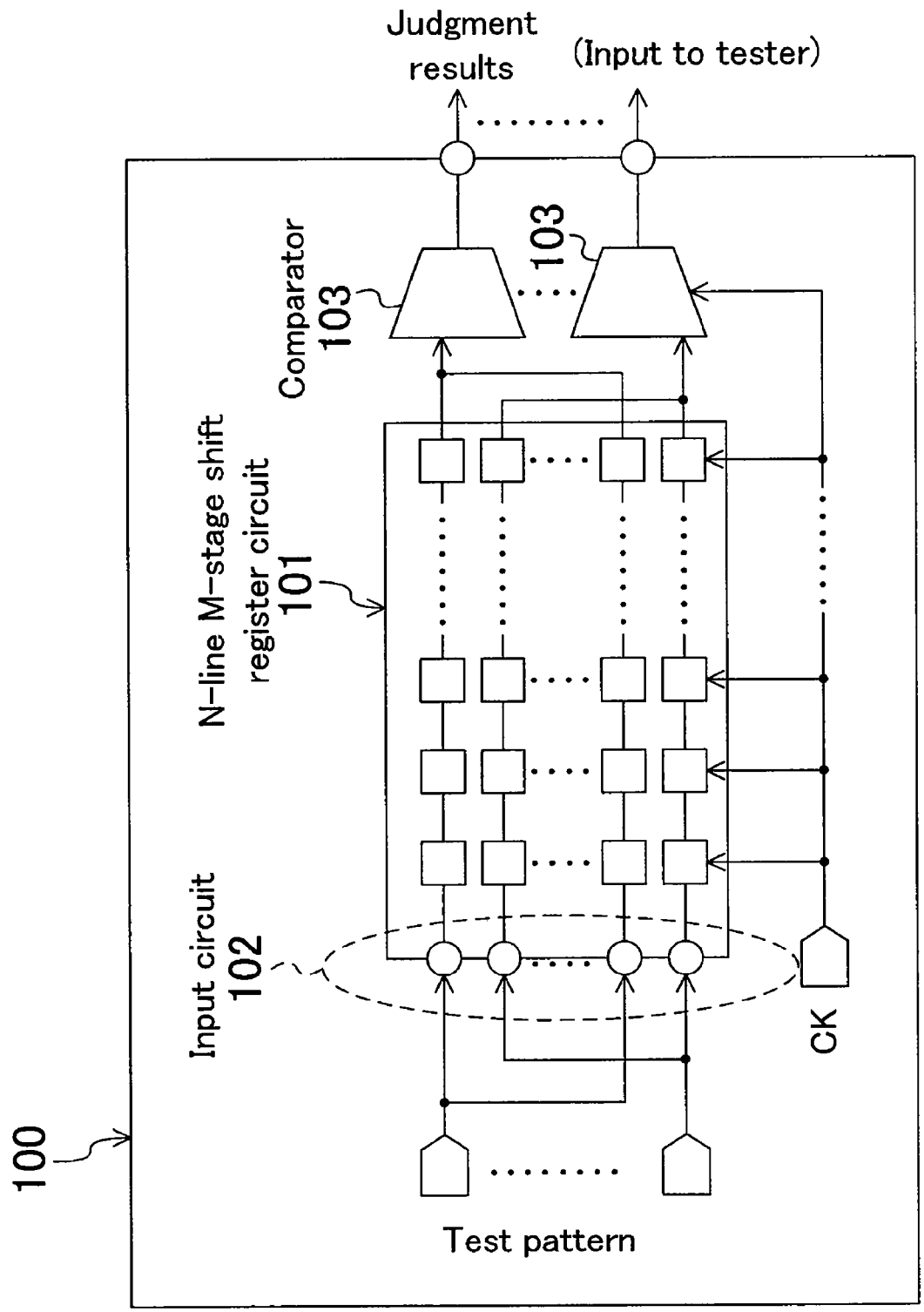
FIG. 2 is a schematic block diagram showing an overall semiconductor device in accordance with Embodiment 2 of the present invention.

FIG. 2 is a block diagram showing a configuration of a semiconductor device in accordance with Embodiment 2. The same reference numerals are assigned to the same components as those of the semiconductor device 100 shown in FIG. 1 for omitting the description thereof.

Difference of Embodiment 2 from Embodiment 1 lies in that: in the N-line M-stage shift register circuit 101 of the semiconductor device 100, the input circuits 102 are physically arranged so as to input a common test pattern to a shift register in a given line and a shift register at least two lines apart from the shift register in the given line for avoiding input of the common test pattern to shift registers in adjacent two lines.

Accordingly, the present embodiment can avoid non-detection of a defect among wirings of shift registers in adjacent lines, which could not be detected through the same test pattern signal.

Embodiment 3

Figure 3:
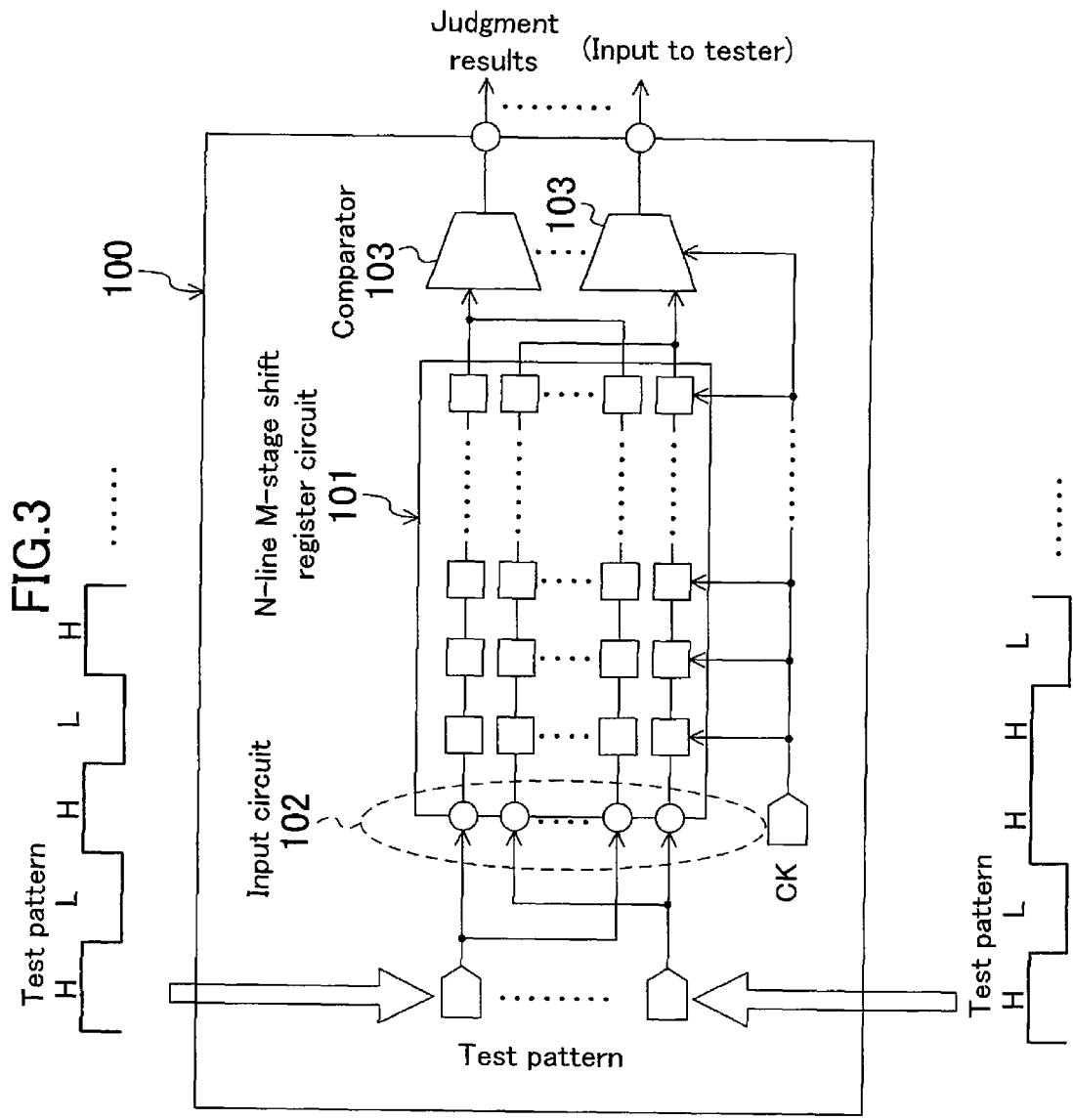
FIG. 3 is a schematic block diagram showing an overall semiconductor device in accordance with Embodiment 3 of the present invention.

FIG. 3 is a block diagram showing a configuration of a semiconductor device in accordance with Embodiment 3. A semiconductor device 100 in the present embodiment has the same configuration as the semiconductor device 100 shown in FIG. 2.

Specific two test patterns simultaneously input to different pairs of shift registers reflect one of the significant features in the present embodiment. Specifically, in the semiconductor device 100 in present embodiment, two test patterns have reverse phases to each other in an arbitrary period. In FIG. 3, the phases of the two test patterns are reverse to each other in the fourth and fifth clock cycles. In the present embodiment, one of the two test patterns is input to a pair of shift registers in given lines at least two lines apart from each other while the other test pattern is input to another pair of shift registers in other lines at least two lines apart from each other, one of the other lines being adjacent to one of the given lines.

Hence, a bridging defect among wirings of the shift registers in arbitrary adjacent two lines can be detected.

Embodiment 4

Figure 4:
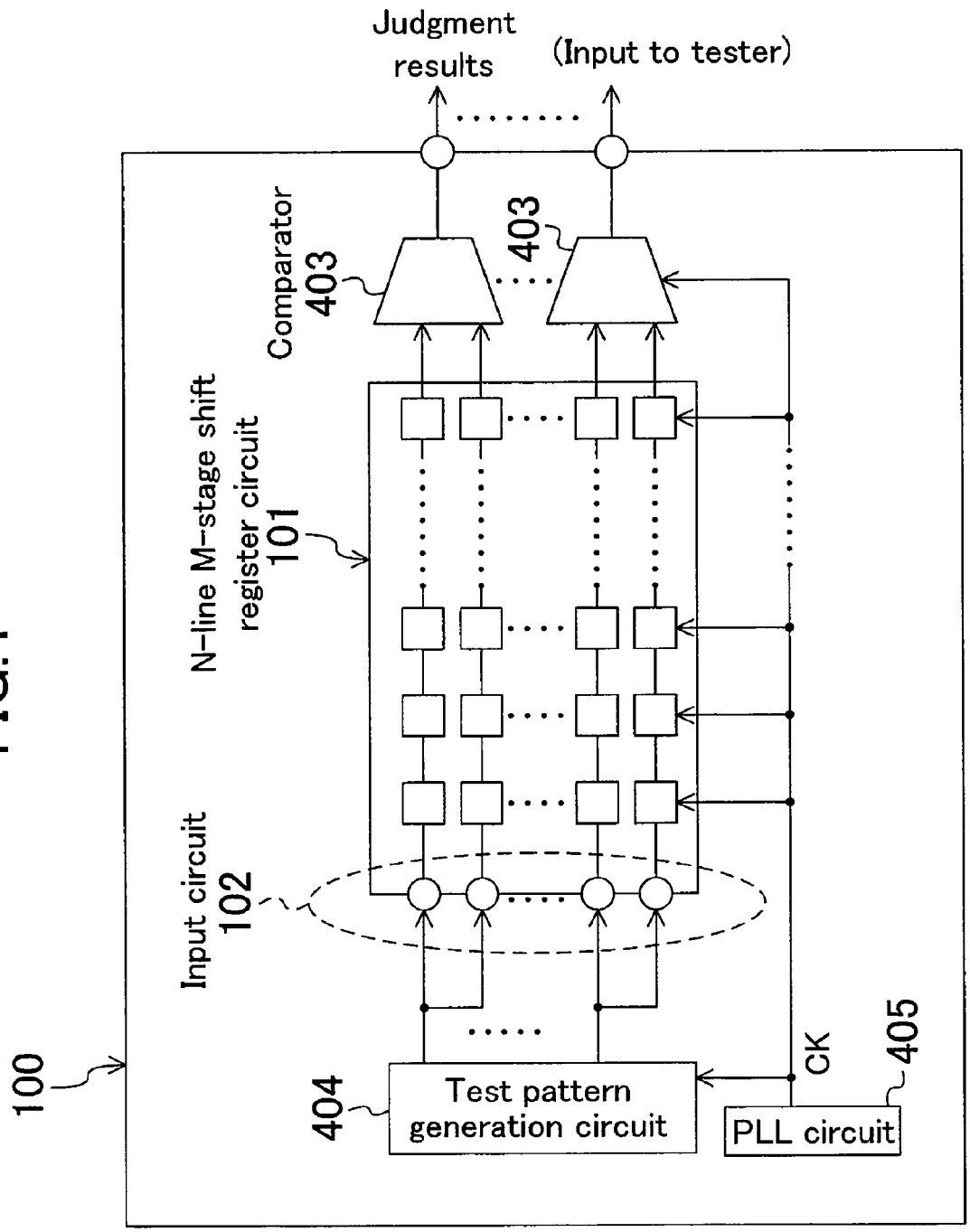
FIG. 4 is a schematic block diagram showing an overall semiconductor device in accordance with Embodiment 4 of the present invention.

FIG. 4 is a block diagram showing a configuration of a semiconductor device in accordance with Embodiment 4. The same reference numerals are assigned to the same components as those of the semiconductor device 100 shown in FIG. 1 for omitting the description thereof.

Difference of Embodiment 4 from Embodiment 1 lies in that a test pattern generation circuit 404 and a PLL circuit 405 (a reference signal generation circuit) are provided in addition. The test pattern generation circuit 404 generates test patterns to be input to the input circuits 102. The PLL circuit 405 generates a clock signal CL at an actual speed (several hundred MHz, for example) of the shift register circuit 101 as a reference signal. The test pattern generation circuit 404 is a configuration including a memory for storing a test pattern in advance.

In the present embodiment, in order to enable a low-speed tester to judge the judgment results output from the semiconductor device 100 at a high speed of several hundred MHz, each comparator 403 is set to output L as an initial output and is fixed to output H only when disagreement is detected after M-th clock cycle from a start of test pattern input.

In the semiconductor device 100 shown in FIG. 4, the test pattern generation circuit 404, the shift register circuit 101, and the comparators 403 are operated in synchronization with the clock signal CK generated at an actual speed of several hundred MHz in, for example, the incorporated PLL circuit 405.

Hence, in the present embodiment, a circuit defect can be detected at an actual speed of several hundred MHz and can be detected also by the low-speed tester, thereby suppressing cost for testing.

What is claimed is:

1. A semiconductor device comprising:
  a N-line M-stage shift register circuit including shift registers of M-stages in N lines in parallel to each other (where M and N each are an integer equal to or larger than 2), a plurality of sets of shift registers in a plurality of lines out of the N lines being formed in the N-line M-stage shift register circuit,
  wherein each of the sets includes:
    an input circuit for inputting a common test pattern to a corresponding set of shift registers in a plurality of lines out of the N lines; and
    a comparator for comparing outputs of a corresponding set of the shift registers in the plurality of lines,
  each of the sets of shift registers to which the common test pattern is input does not include shift registers in lines adjacent to each other, and
  one of two test patterns is input to a set of shift registers in given lines at least two lines apart from each other while the other test pattern is input to another set of shift registers in other lines at least two lines apart from each other, one of the other lines being adjacent to one of the given lines, and the two test patterns having phases opposite to each other in an arbitrary period.

2. The semiconductor device of claim 1, further comprising:
   a reference signal generation circuit for generating a clock signal as a reference signal, wherein each of the sets of shift registers in the plurality of lines includes:
   an input circuit for inputting a common test pattern to a corresponding set of shift registers in a plurality of lines out of the N lines; and
   a comparator for comparing outputs of a corresponding set of the shift registers in the plurality of lines, and
   wherein the N-line M-stage shift register circuit and the comparator circuits in each of the sets are operated in synchronization with the clock signal supplied from the reference signal generation circuit.

3. The semiconductor device of claim 2, further comprising:
   a test pattern generation circuit for inputting the test pattern to the input circuit in each of the sets, the test pattern generation circuit being operated in synchronization with the clock signal supplied from the reference signal generation circuit.

* * * * *